United States Patent
Fang

(10) Patent No.: US 6,791,380 B2
(45) Date of Patent: Sep. 14, 2004

(54) UNIVERSAL CLOCK GENERATOR

(75) Inventor: Wen-Chi Fang, Kaohsiung (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/995,423

(22) Filed: Nov. 27, 2001

(65) Prior Publication Data

US 2003/0098729 A1 May 29, 2003

(51) Int. Cl.[7] .............................................. H03L 7/06
(52) U.S. Cl. ........................ 327/156; 327/158; 327/162
(58) Field of Search ................................ 327/156, 158, 327/161–163, 172, 291, 293, 294–299, 147, 149, 152, 153, 141, 144, 145, 165; 331/12, 18; 375/376

(56) References Cited

U.S. PATENT DOCUMENTS

| | | | | |
|---|---|---|---|---|
| 5,077,686 A | * | 12/1991 | Rubinstein ................... | 395/550 |
| 5,095,280 A | * | 3/1992 | Wunner et al. .............. | 327/145 |
| 5,345,449 A | * | 9/1994 | Buckingham et al. ....... | 370/518 |
| 5,461,332 A | * | 10/1995 | Mirov et al. ................. | 327/41 |
| 5,481,573 A | * | 1/1996 | Jacobowitz et al. ......... | 375/356 |
| 5,565,816 A | * | 10/1996 | Coteus .......................... | 331/2 |
| 5,691,660 A | * | 11/1997 | Busch et al. ................. | 327/147 |
| 5,696,950 A | * | 12/1997 | Ichinose et al. ............. | 395/556 |
| 5,717,353 A | * | 2/1998 | Fujimoto ..................... | 327/276 |
| 5,757,212 A | * | 5/1998 | Sevalia ........................ | 327/105 |
| 5,844,954 A | * | 12/1998 | Casasanta et al. .......... | 375/373 |
| 6,157,226 A | * | 12/2000 | Ishimi ......................... | 327/116 |
| 6,263,448 B1 | * | 7/2001 | Tsern et al. ................. | 713/501 |
| 6,285,172 B1 | * | 9/2001 | Torbey ........................ | 323/237 |
| 6,289,068 B1 | * | 9/2001 | Hassoun et al. ............ | 375/376 |
| 6,396,887 B1 | * | 5/2002 | Ware et al. .................. | 375/354 |
| 6,429,715 B1 | * | 8/2002 | Bapat et al. ................. | 327/295 |
| 6,456,128 B1 | * | 9/2002 | Nakamura ................... | 327/149 |
| 6,515,519 B1 | * | 2/2003 | Miyazaki et al. ........... | 327/105 |

\* cited by examiner

Primary Examiner—Timothy P. Callahan
Assistant Examiner—Hai L. Nguyen
(74) Attorney, Agent, or Firm—Ladas & Parry

(57) ABSTRACT

The present invention discloses a universal clock generator, which comprises a high frequency clock region for generating high frequency clocks and a low frequency clock region for generating high frequency clocks. The low frequency clock region includes at least one delay lock loop for increasing the number of high frequency clocks of the high frequency clock region. When the number of high frequency clocks (such as a CPU clock, SDRAM clock, AGP clock and PCI clock) is not enough, the delay lock loop of the low frequency clock region can be cascaded to support insufficient clocks.

4 Claims, 3 Drawing Sheets

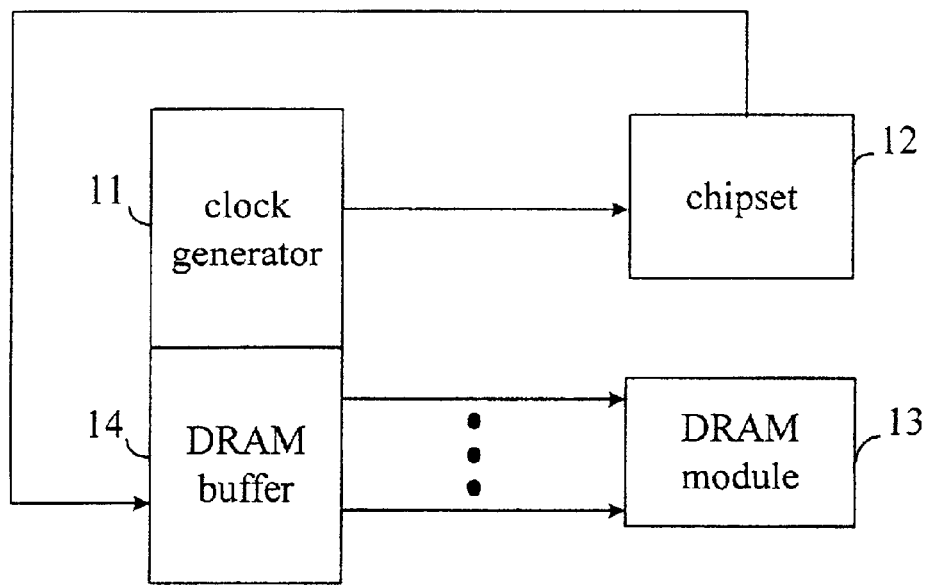
FIG. 1(c)   (Prior Art)
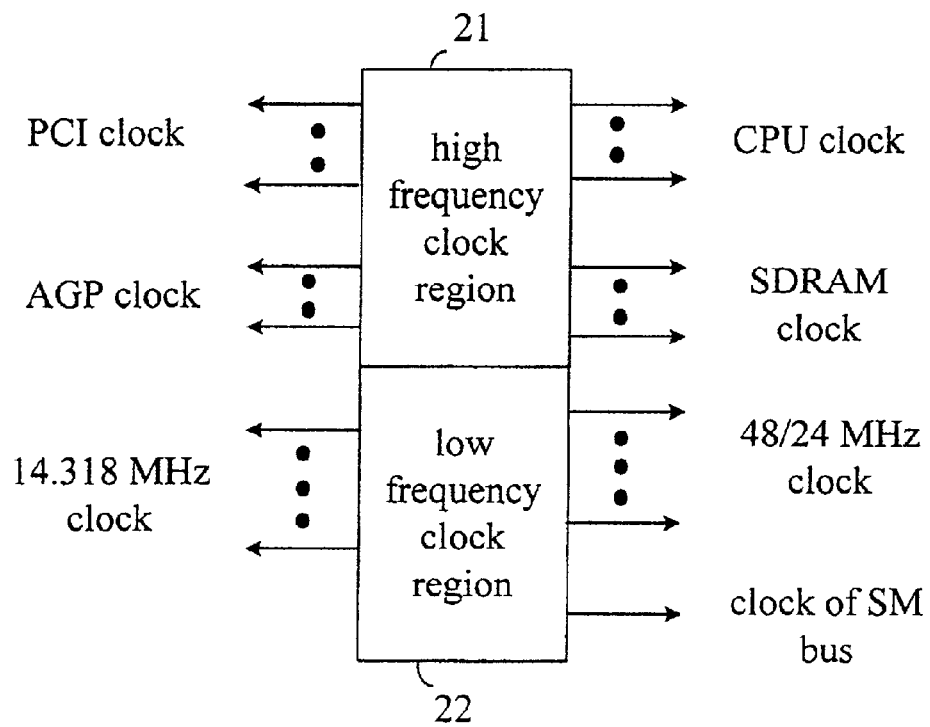
FIG. 2    (Prior Art)

UNIVERSAL CLOCK GENERATOR

BACKGROUND OF THE INVENTION

1. Field of the Invention

The present invention relates to a clock generator, particularly to a universal clock generator suitable to be placed on every motherboard.

2. Description of Related Art

For the demands of different chipsets and personal computers, it is necessary to modify the structure of a clock generator. The output structure of a known clock generator 11 is shown in FIG. 1(a), which outputs clocks with all possible frequencies to all components (such as chipset 12 and DRAM module 13) on the motherboard. The output structure of another known clock generator 11 is shown in FIG. 1(b), which outputs a clock frequency to the chipset 12. After that, the chipset 12 outputs a reference frequency to a DRAM buffer 13, which further expands the number of clocks output to the DRAM module 13. Comparing to FIG. 1(a), it is more convenient to control the output of the DRAM frequency using the structure in FIG. 1(b). The output structure of a known clock generator 11 is shown in FIG. 1(c), which combines the DRAM buffer 14 and clock generator 11 in FIG. 1(b) into a single IC.

If the clock generator 11 is classified in accordance with the number of output clocks, it may be classified into a high frequency clock region 21 and a low frequency clock region 22, as shown in FIG. 2. The low frequency clock region 22 outputs fixed frequency clocks in general, such as 48/24 MHz, 14.318 MHz and the clock of an SM bus. Relatively, the design of a CPU clock, SDRAM clock, PCI clock and AGP clock in the high frequency clock region 21 always have to be modified according to the demand of the number of different clocks and the design of objects to which the clocks connect (such as a design of push and pull or open drain).

In other words, since the known clock generator 11 has to integrate different clock demands of different components on the motherboard, it will raise the manufacturing cost and lower down product compatibility due to a continuing modification. In order to solve with the above problem, the present invention proposes a novelty universal clock generator to overcome it.

SUMMARY OF THE INVENTION

The main object of the present invention is to provide a universal clock generator suitable to the demand of providing a large amount of different clock pins on a motherboard.

The second object of the present invention is to provide a universal clock generator so as to reduce the design and testing cost for motherboard and clock generator manufacturers.

To obtain the above purpose, the clock generator of the present invention comprises a high frequency clock region for generating high frequency clocks and a low frequency clock region for generating high frequency clocks. The low frequency clock region includes at least one delay lock loop for increasing the number of high frequency clocks of the high frequency clock region. When the number of the high frequency clocks (such as CPU clock, SDRAM clock, AGP clock and PCI clock) is not high enough, the delay lock loop of the low frequency clock region can be cascaded to support insufficient clocks. Besides, the output clocks of the delay lock loop can support a buffering function, and some clocks having a high variability (such as a CPU clock) can be set up as a push-pull, open-collector or differential output by a power-on setting pin for increasing the application.

BRIEF DESCRIPTION OF THE DRAWINGS

The present invention will be described according to the appended drawings in which:

FIGS. 1(a) to (c) show prior art clock generators;

FIG. 2 shows a prior art clock generator; and

PREFERRED EMBODIMENT OF THE PRESENT INVENTION

Figure 1A:
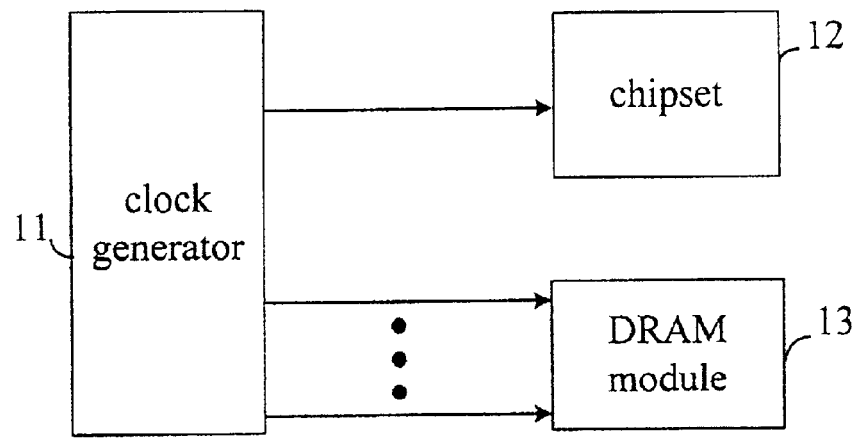
Figure 1B:
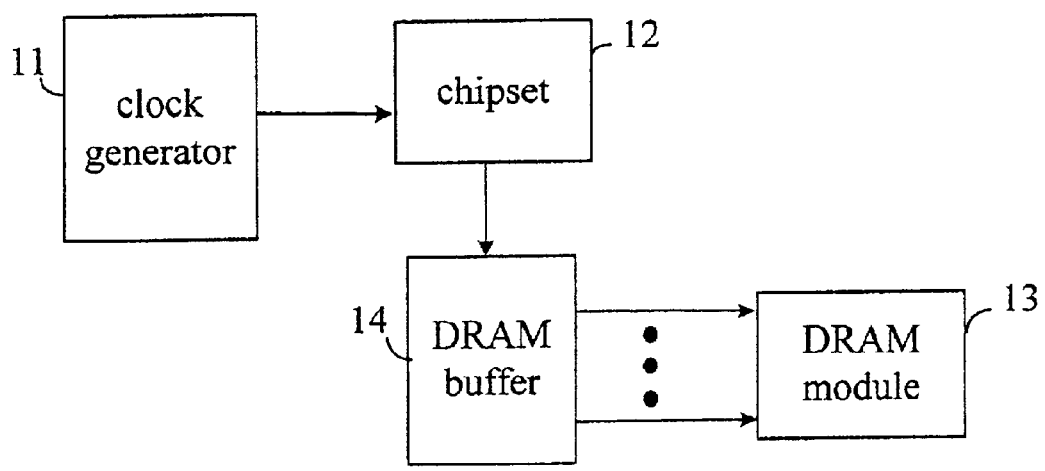
Figure 3:
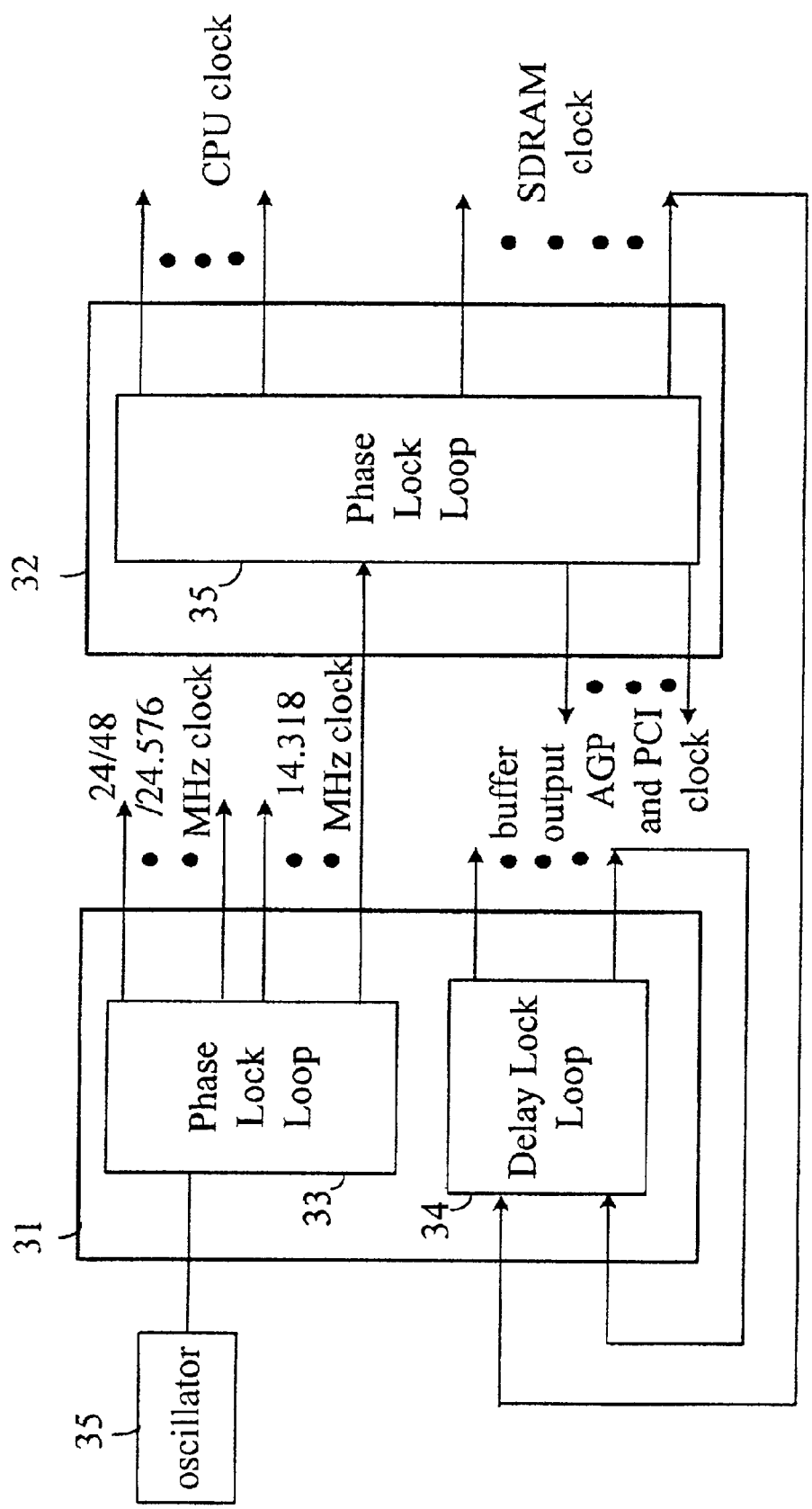
FIG. 3 shows a hint diagram of a universal clock generator of the present invention.

FIG. 3 shows a hint diagram of a universal clock generator of the present invention, comprising a low frequency clock region 31, a high frequency clock region 32 and an oscillator 35 connecting to the low frequency clock region 31. The high frequency clock region 32 and low frequency clock region 31 can be grouped into a single chip or separated into two individual ICs. The low frequency clock region 31 includes a phase Lock Loop (PLL) connected to the oscillator 35 for generating prior 24/48/24.576 MHz clocks and 14.318 MHz clock. The high frequency clock region 32 also includes a PLL 35, which utilizes an output baseband clock (such as 14.318 MHz) of the PLL 33 in the low frequency clock region 31 as an input reference clock for generating a CPU clock, SDRAM clock, AGP clock and PCI clock. One characteristic of the present invention is that the low frequency clock region 31 includes a Delay Lock Loop (DLL) 34, which provides the function of a zero-delay clock buffering for duplicating necessary clocks. Therefore, the SDRAM clocks of the high frequency clock region 32 can connect to input ends of the DLL 34 of the low frequency clock region 31 so as to satisfy the demand of placing a large amount of different clock pins on a motherboard. Besides, output ends of the DLL 34 can also connect to input ends of the DLL for further increasing the number of output clocks. Furthermore, the low frequency clock region can further include at least one DLL 34 for increasing a usage complexity. In other words, the universal clock generator can meet the requirement of being adaptable to different designs of motherboards, and a user merely needs to adjust the configuration of the DLL 34 of the low frequency clock region 31 to obtain the necessary number of clocks. In another aspect, since the present invention standardizes the clock generator, it facilitates the design a motherboard.

In addition, the output clocks of the DLL can support a buffering function, and some clocks having a high variability (such as a CPU clock) can be set up as a push-pull, open-collector or differential output by a power-on setting pin for increasing an application complexity.

The above-described embodiments of the present invention are intended to be illustrative only. Numerous alternative embodiments may be devised by those skilled in the art without departing from the scope of the following claims.

What is claimed is:

1. An universal clock generator comprising:

only one high frequency clock region having only one phase lock loop for generating high frequency clocks, the high frequency clock region being integrated in a first chip;

a low frequency clock region connecting to the high frequency clock region and integrated in a second chip, the low frequency clock region including:
(a) only one phase lock loop for generating low frequency clocks, and
(b) at least one delay lock loop for increasing a number of the high frequency clocks of the high frequency clock region; and an oscillator connected to the low frequency clock region.

2. The universal clock generator of claim 1, wherein output ends of the delay lock loop feedback to input ends of the delay lock loop for increasing a number of output clocks.

3. The universal clock generator of claim 1, wherein the low frequency clock region outputs a baseband clock acting as a reference frequency of the high frequency clock region.

4. The universal clock generator comprising:
only one high frequency clock region for generating high frequency clocks, the high frequency clock region being integrated in a first chip;
a low frequency clock region connecting to the high frequency clock region and integrated in a second chip, the low frequency clock region including:
(a) only one phase lock loop for generating low frequency clocks; and
(b) at least one delay lock loop for increasing a number of the high frequency clocks of the high frequency clock region; and an oscillator connected to the low frequency clock region.

* * * * *